United States Patent [19]
Akai et al.

[11] 4,063,972
[45] Dec. 20, 1977

[54] METHOD FOR GROWING EPITAXIAL LAYERS ON MULTIPLE SEMICONDUCTOR WAFERS FROM LIQUID PHASE

[75] Inventors: Shin-ichi Akai, Osaka; Hideki Mori, Sakai; Takashi Shimoda, Osaka; Shin-ichi Iguchi, Nishinomiya, all of Japan

[73] Assignee: Sumitomo Electric Industries, Ltd., Osaka, Japan

[21] Appl. No.: 667,867

[22] Filed: Mar. 17, 1976

[30] Foreign Application Priority Data

Mar. 26, 1975    Japan ................................ 50-37319

[51] Int. Cl.$^2$ .......................................... H01L 21/208
[52] U.S. Cl. .................................... 148/171; 118/418; 148/172; 252/62.3 GA
[58] Field of Search ............... 148/171, 172; 118/418; 252/62.3 GA

[56] References Cited

U.S. PATENT DOCUMENTS

| | | | |
|---|---|---|---|
| 3,631,836 | 1/1972 | Jarvela et al. | 118/415 |
| 3,765,959 | 10/1973 | Unno et al. | 148/172 |
| 3,809,584 | 5/1974 | Akai et al. | 148/172 |
| 3,880,680 | 4/1975 | Weyrich et al. | 148/171 |
| 3,881,037 | 4/1975 | Grandia et al. | 427/87 |
| 3,909,317 | 9/1975 | Itoh et al. | 148/171 |
| 3,933,538 | 1/1976 | Akai et al. | 148/171 |

*Primary Examiner*—G. Ozaki
*Attorney, Agent, or Firm*—Carothers and Carothers

[57] ABSTRACT

A plurality of single-crystal epitaxial layers of semiconductors are simultaneously grown on a plurality of suitable substrates from the liquid phase by a method which includes the step of consecutively, and at times simultaneously, supplying small portions of liquid solution from a solution reservoir onto all the surfaces of the substrates in a plurality of wells which are provided on a surface of a rotatable circular lower plate so that epitaxial growth can be simultaneously carried out in all wells. The solution reservoir is positioned on a radius of the lower plate on which a circular upper plate is also provided in a non-rotatable state relative to the solution reservoir. Small portions of liquid solution are supplied by rotating the lower plate relative to the upper plate and the solution reservoir, and constrained in shape and volume which are adjusted by the upper plate and the wells. The composition and doping level of epitaxial layers are controlled through vapor-liquid communication.

13 Claims, 7 Drawing Figures

METHOD FOR GROWING EPITAXIAL LAYERS ON MULTIPLE SEMICONDUCTOR WAFERS FROM LIQUID PHASE

BACKGROUND OF THE INVENTION

1. Field of the Invention

This invention relates to a method for mass production of single-crystal epitaxial layers of semiconductors from the liquid phase. More particularly, this invention is adaptable for growing the epitaxial layers with single-layer structure, double-layer structure or multi-layer structure of Group III-V semiconductors such as GaP and $Ga_{1-x}Al_xAs$ ($0 < x < 1$).

The vapor phase epitaxial growth method for manufacturing epitaxial layers of GaAs and $GaAs_{1-x}P_x$ ($0 < x < 1$) on a GaAs substrate, or the epitaxial layers of $GaAs_{1-x}P_x$ ($0 < x < 1$) on the GaP substrate has made rapid progress. Recently, 30 - 50 wafers, with each having a surface area of 10 - 20 cm², have been able to be manufactured in a single epitaxial growth run by the method. Contrary to this method, the liquid phase epitaxial growth method for growing the epitaxial layers of GaP on the GaP substrate and $Ga_{1-x}Al_xAs$ ($0 < x < 1$) on the GaAs substrate has been often pointed out to be lacking in mass producibility, while further pointing out that the method can provide very high quality epitaxial layers for light emitting diodes and semiconductor lasers.

2. Description of the Prior Art

Various attempts at imparting mass productivity to the liquid phase epitaxial growth method are dealt with in detail in, for example, a paper by R. H. Saul and O. G. Lorimor, entitled "Liquid Phase Epitaxy Processes for GaP LED's", Journal of Crystal Growth, Vol. 27, (1974), pp. 183 - 192. Especially, the thin-melt multi-slice slider method (hereinafter to be referred to as the thin-melt method) is introduced therein in detail. This method has advantages in that it enables one to obtain an epitaxial growth layer of a uniform thickness having an especially smooth surface, that the quantity of solvent for the liquid solution required by it is small, that it enables one to obtain an epitaxial growth layer of a single layer structure or multi-layer structure (particularly, pn junction layer) by a single process, and that the GaP light emitting diodes obtained by it have an excellent quantum efficiency. FIGS. 1(a) and (b) are diagrams explanatory of the thin-melt method. As shown in FIG. 1(a), a solution reservoir 1 containing the solution 2 and wells 5, as well as a slider 6 which also serves as a supporting base for the substrate 3, a cover plate 4 and a cover plate 9 which has vapor-pervious thin holes 7 are all provided in a long horizontal reaction tube which is heated to a uniform temperature. The substrate 3 is a single crystal of GaP and the liquid solution contains GaP of a concentration that saturates the solvent Ga.

Sulphur S for n- type impurity, nitrogen N for radiative center and zinc Zn for p-type impurity are doped into the growth layers respectively from $H_2S$ gas, $NH_3$ gas and Zn vapor contained in the hydrogen or inert or neutral gas. The slider 6 is moved to the right from the state shown in FIG. 1(a), and the liquid solution 2 is supplied into the well 5 as shown in FIG. 1(b) to prepare a supplied liquid solution that is the thin melt 8 of a small portion of liquid solution, which is slowly cooled in that position with the flow of gas. The gas contains $H_2S$ and $NH_3$ at the beginning so as to grow an n layer containing N and S. Then the cooling is stopped and the gas is changed to a gas containing Zn and $NH_3$ but no $H_2S$, and cooling is continued. In this way an n layer and a p layer are grown in continuation on an n+ substrate in a single process. This method has a number of advantages as already mentioned, but it has a shortcoming in that it necessarily calls for a large idle space because of the operation of a horizontally long slider 6. From FIG. 1, it will be obvious that the space required for the actual growth of epitaxial layers on a substrate 3 is found to be too small for the whole space occupied by the apparatus.

On the other hand, a method in which a rotatable circular plate is used, was proposed in one of the attempts at improving the mass producibility of the liquid phase epitaxial growth method. One example of the embodiment of this method is shown in FIG. 2. FIG. 2(b) is a top view and FIG. 2(a) is a cross-sectional view taken along B-A-C of FIG. 2(b).

The liquid solution 2 is put in the solution reservoir 1, which is placed on the substrate holder 10 of a circular plate. The substrate holder 10 has a well 5 and the substrate 3 is placed therein.

The solution reservoir 1 and the substrate holder 10 are so made that they are mutually rotatable about the central axis A-A'. If they are mutually rotated 90 degrees from the positions shown in FIG. 2(b), then the substrate 3 positions just under the liquid solution 2 and the epitaxial growth can be accomplished in that position.

This method (which is called the rotating slider method) has an advantage in that, unlike the method illustrated in FIG. 1, it does not call for a horizontally long slider. Nevertheless, it still has a shortcoming in that the space actually taken or usable in the structure for growing epitaxial layers on the substrate 3 is too small.

SUMMARY OF THE INVENTION

The present invention provides a liquid phase epitaxial growth method suitable for mass production, which is free from the afore-mentioned shortcomings and which enables one to make full use of a given space which is heated to a uniform temperature.

In accordance with the teachings of this invention, a method is provided for simultaneously growing a plurality of single-crystal epitaxial layers of semiconductors on a plurality of suitable substrates from the liquid phase. The method includes the step of supplying small portions of liquid solution from a solution reservoir consecutively, and simultaneously to some, onto all the surfaces of the substrates contained in a plurality of wells which are provided on a surface of a rotatable circular lower plate with a single full revolution so that all wells are thereafter simultaneously full for simultaneous epitaxial growth in all wells. The solution reservoir is positioned on a radius of the lower plate on which a circular upper plate is provided in a non-rotational state relative to the solution reservoir. Small portions of liquid solution are supplied to the wells, some simultaneously and others consecutively, by rotating the lower plate relative to the upper plate and the solution reservoir, and these portions of liquid are constrained or defined in shape and volume which are regulated by the confines of the upper plate and the wells.

According to the rotating slider method which has so far been realized, epitaxial layers are grown while the substrate is positioned under the solution reservoir and is in contact with the liquid solution therein. In consequence, the method has been unable to free itself from the shortcoming already mentioned with reference to FIG. 2. A conceivable method also exists in which epitaxial layers are grown on a substrate which has been moved to a position having a lower temperature than the solution reservoir after the liquid solution has been supplied on that one piece of a substrate. This method, however, is not suitable for mass production, because it is exceedingly difficult to make a circular plate construction which has a temperature gradient in its circumferential direction.

If epitaxial layers are simultaneously grown after the liquid solution has been supplied onto all of a plurality of substrates as taught by the present invention, it is possible to effect uniform heating and cooling of the circular substrate holder, so that the method enjoys a characteristic feature in that it retains the advantages of the thin-melt method shown in FIG. 1 and at the same time it makes full (efficient) use of the space heated to a uniform temperature.

If multi-layer epitaxial layers are grown by the rotating slider method heretofore employed, it calls for a plurality of solution reservoirs. Furthermore, in case impurities are doped into them from the vapor phase, it has been found necessary to lead gas flows containing different impurities to different solution reservoirs respectively. The method of the present invention, however, makes it possible to carry out the multi-layer epitaxial growth with only one solution reservoir in use. Moreover, the method of the present invention has a prominent advantage which is not enjoyed by the conventional thin-melt method.

That is to say, such a rotating slider method as the method of the present invention is easily applicable to the so-called temperature gradient liquid phase epitaxial growth method, which is a method in which epitaxial layers are simultaneously grown while maintaining a constant temperature by providing a temperature gradient above and below the liquid solution (the upper, the higher temperature). The method still has the advantage in that, unlike the rotating slider method heretofore used, it entails little idle space.

It is a primary object of this invention to provide a novel improved method for mass production of single-crystal epitaxial layers with uniform thickness and uniform doping level of semiconductors from the liquid phase.

Another object of this invention is to provide a method for controlling the composition and doping level of epitaxial layers effectively through vapor-liquid communication.

Still another object of this invention is to provide a novel apparatus for manufacturing as many single-crystal epitaxial layers as possible in a single growth run with the use of a given hot zone.

Other objects and advantages of this invention will, in part, become obvious, and will, in part, appear hereinafter.

BRIEF DESCRIPTION OF THE DRAWINGS

Other objects and advantages appear in the following description and claims.

The accompanying drawings show, for the purpose of exemplification without limiting the invention or the claims thereto, certain practical embodiments illustrating the principles of this invention wherein:

DETAILED DESCRIPTION OF THE INVENTION

This invention will now be described in more detail with reference to the Example. Although an apparatus for manufacturing single-crystal epitaxial layers of GaP and production of the layers of GaP are illustrated in the Example, it will be obvious to those skilled in the art, that this invention can be applied to the preparation of single-crystal epitaxial layers of other various semiconductors.

Example:

In this example of embodiment, an $n$ layer and a $p$ layer were grown in one process on an n-type GaP single crystal substrate of a diameter of 30 – 50 mm grown by the LEC method (liquid encapsulated Czochralski method).

Figure 1A:
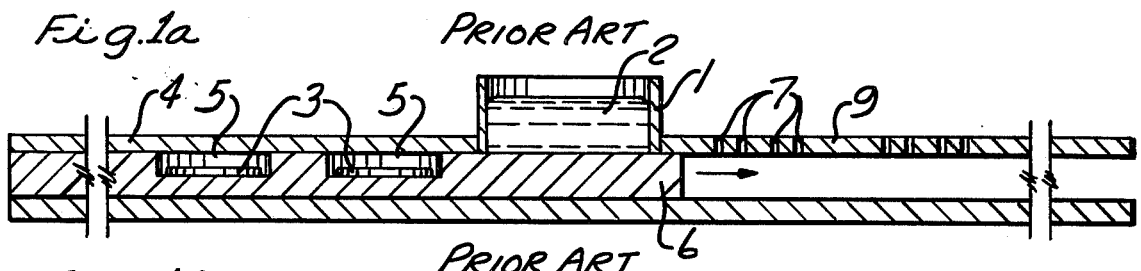
FIGS. 1(a) and (b) are diagrammatic views showing the vertical section of an apparatus of the prior art which is used for the thin-melt method, which is described in detail hereinbefore.
Figure 1B:
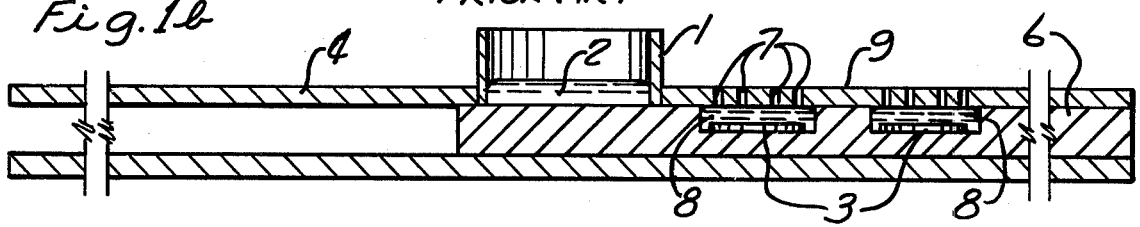
Figure 2A:
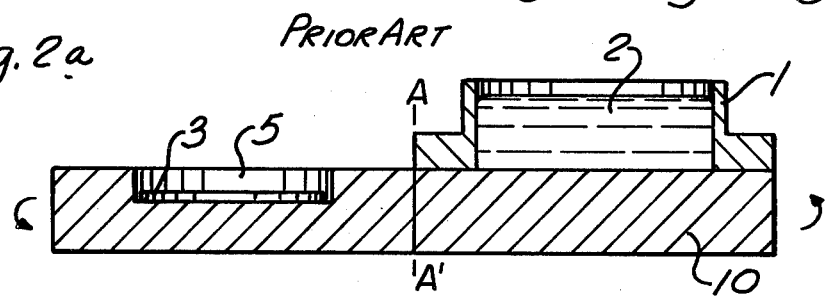
FIGS. 2(a) and (b) are diagrammatic views showing the vertical section and top view, respectively, of an apparatus which is used for the rotating slider method of the prior art, which is also described in detail hereinbefore.
Figure 2B:
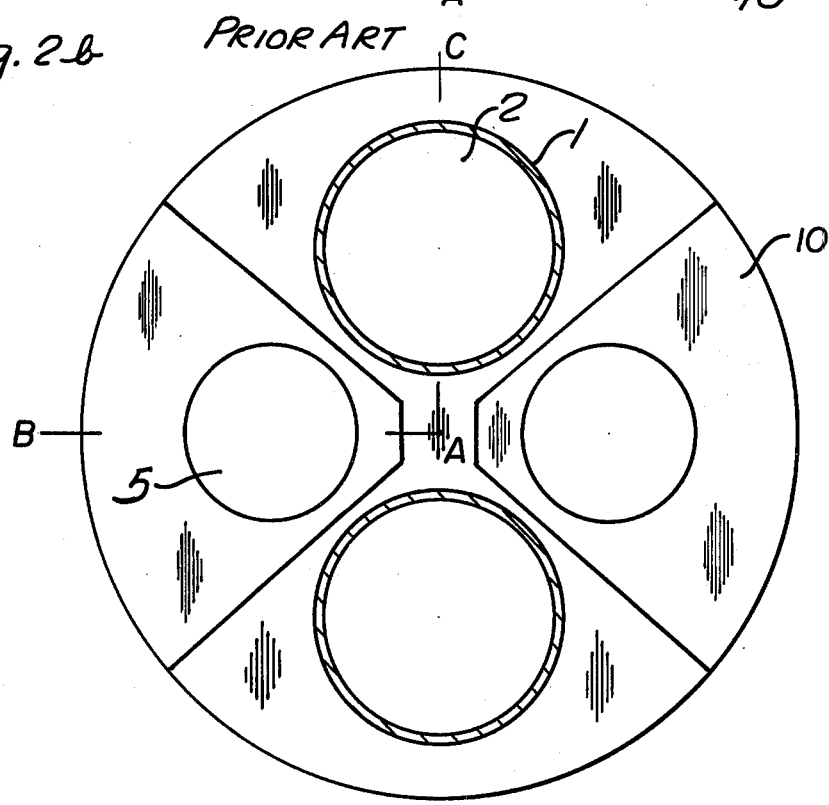
Figure 3:
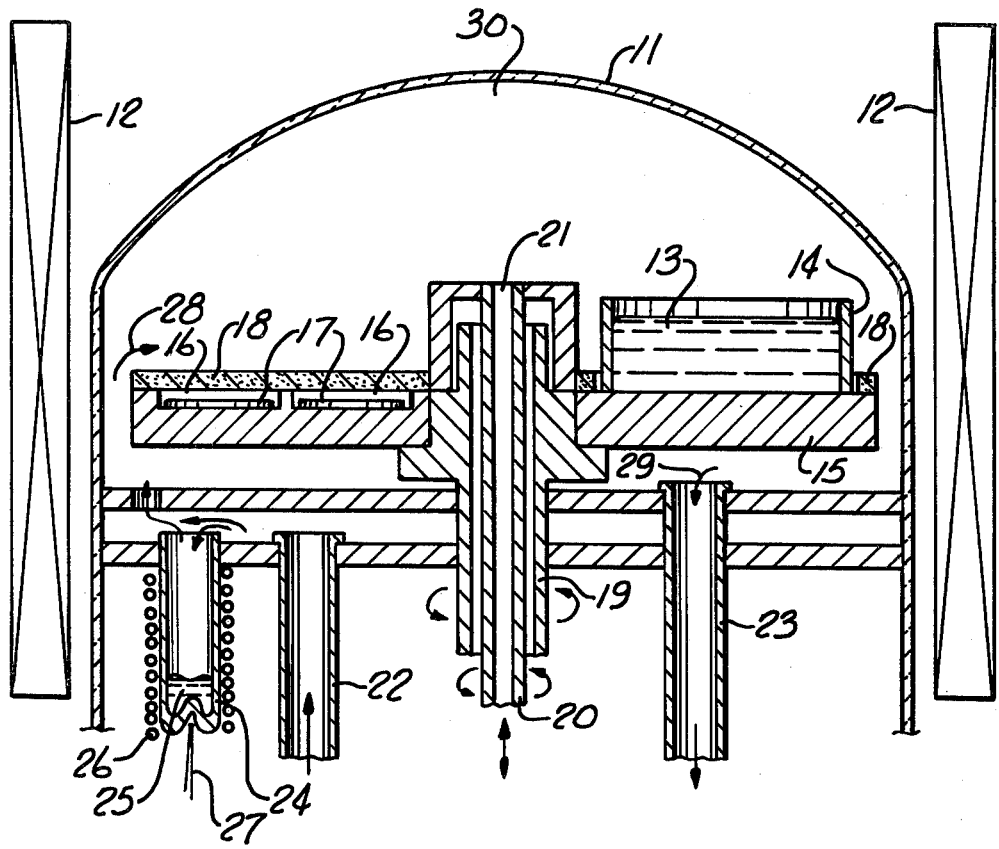
FIG. 3 is a diagrammatic view showing the vertical section of an apparatus for manufacturing single-crystal epitaxial layers of semiconductors, which is used for the practice of the embodiment of this invention.

FIG. 3 is a vertical cross-sectional view of the essential part of a mass production liquid phase epitaxial growth apparatus used in the embodiment of the present invention. The main part of the apparatus is constructed in a quartz bell jar 11 and is heated by means of a heater 12 as uniformly as possible in horizontal planes and to create a temperature gradient as required in the vertical direction with higher temperatures in higher planes. If necessary, the bell jar 11 and heater 12 may be installed in a water-cooled metallic bell jar and purged by flowing hydrogen gas or inert or neutral gas outside the quartz bell jar. The liquid solution 13 is contained in the solution reservoir 14 and is positioned on the rotatable circular lower plate 15.

The lower plate 15 is provided with a plurality of wells 16, and GaP single crystal substrates 17 are placed therein. The crystallographic orientation of the substrates selected is in a {111}B or {100} face. The wells 16 are covered with a circular upper plate 18, and this circular upper plate 18 serves as the cover of the circular lower plate 15, except for the area which receives the solution reservoir 14.

The lower plate 15 is installed on the axle 19 of substrate rotation and the upper plate 18 is installed on the axle 20 of rotation of the upper plate 18 itself and the solution reservoir. The solution reservoir 14 rotates together with the upper plate 18, but it is possible to move the upper plate 18 alone while the solution reservoir 14 is kept motionless on the lower plate 15. That is to say, the axle of rotation 20 is capable of making relative vertical movement with respect to the axle of rotation 19. Furthermore, the axle of rotation 19 and the axle of rotation 20 can make vertical movement together as one body for the purpose of selecting an optimum position of the lower plate 15. The central passage 21 of the axle of rotation 20 may be used for the inlet or outlet of gas. Needless to say, this passage may be closed. Numeral 22 denotes the gas inlet and 23 the gas outlet. The supplier 24 of the vapor of the constituent or an impurity is provided at a position different from the positions of the axles of rotation 19 and 20. In it is placed the solid or liquid source 25. It is heated by means of the subheater 26 and is controlled to an optimum temperature by means of the thermocouple 27. It is important in letting the gas in and out to see to it that the inlet gas flow 28 and the outlet gas flow 29 do not interfere with each other, and that they do not become short-circuited without creating a desired atmosphere in the space 30 within the bell jar 11.

Figure 4:
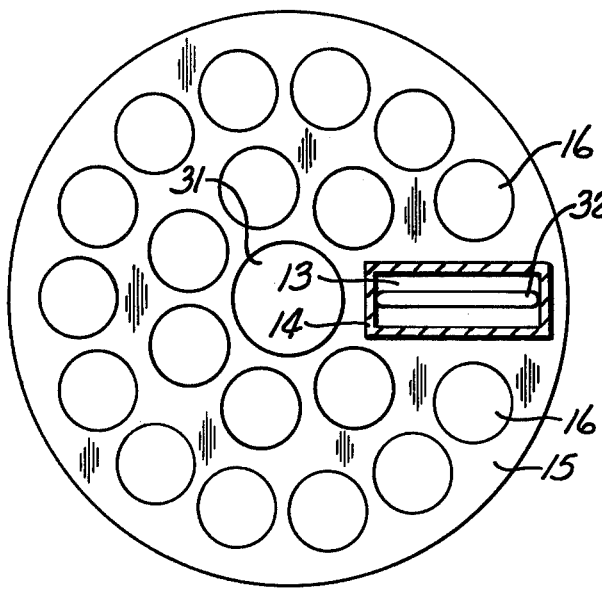
FIG. 4 is a diagrammatic view showing the top of the rotatable circular lower plate and the solution reservoir in section of the apparatus shown in FIG. 3.

FIG. 4 is a top view of the rotatable circular lower plate 15 of the apparatus shown in FIG. 3, and the solution reservoir 14 placed thereon. Numeral 31 denotes the hole through which the axle of rotation 19 is projected. 32 denotes the solution supplying opening, which is long in the radial direction with a narrow width, provided in the bottom of the solution reservoir 14. The wells 16, in principle, may be provided in any part of the lower plate 15, except for the area of the solution supplying opening 32.

Figure 5:
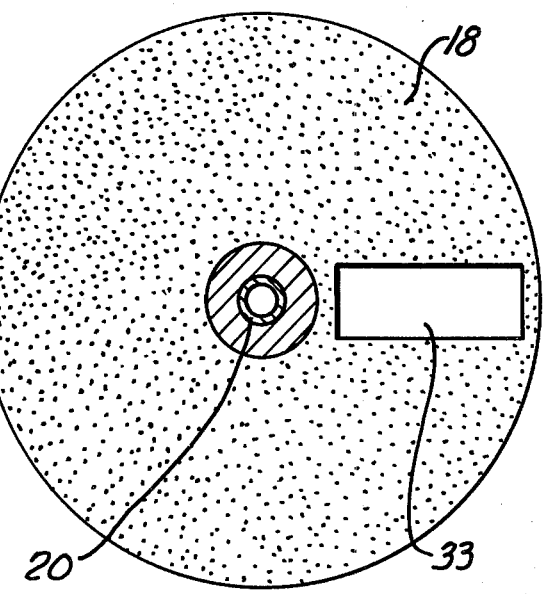
FIG. 5 is a diagrammatic view showing the top of the upper plate which is a part of the apparatus shown in FIG. 3.

FIG. 5 is a top view of the circular upper plate 18 of the apparatus shown in FIG. 3. The hole 33 is made in the neighborhood of the solution reservoir 14. In case the circular upper plate 18 and the solution reservoir are used always in one unit, the size of this hole 33 will be large enough if it is equal to the area of the solution supplying opening 32.

It is obvious that the liquid phase epitaxial growth method of the present invention, which has various characteristic features, can be put into practice by using such an apparatus as used in this example. Now a concrete example of the embodiment will be described.

First, a porous material was selected for the circular upper plate 18 to make it vapor-pervious. The liquid solution 13 was Ga solution saturated with GaP, and sulphur S, which is an n-type impurity, was added in the form of $Ga_2S_2$. In the vapor supplier 24 shown in FIG. 3, zinc Zn 25 was supplied. After the atmosphere 30 was made a vacuum at room temperature, hydrogen gas of high purity was flowed after nitrogen gas purge and the temperature of the liquid solution 13 was made approximately 1,000° C by means of the heater 12.

After 10 minutes, the circular lower plate 15 was turned and the liquid solution 13 was supplied onto the GaP single crystal substrates 17 in the wells 16 to make a a plurality of layers of the supplied liquid solutions having a thickness of approximately 1.5 mm. After an additional twenty minutes, the temperature was lowered at a rate of approximately 1.6° C/minute until it became approximately 900° C, and an n layer of approximately 35 μm was grown on the substrate having a {111}B face of n+ type GaP. After the supply of liquid solution, $H_2S$ gas and $NH_3$ gas were added to the hydrogen gas to dope S and N into the n-type grown layer. Then, the atmosphere was made to be exclusively hydrogen and $NH_3$ and the Zn source 25 was heated to 600° C by means of the subheater 26. After 30 minutes, cooling was done at a rate of approximately 6° C/minute in order to effect epitaxial growth again, while keeping the temperature of the Zn source at 600° C. After fifteen minutes, the supply of $NH_3$ gas was stopped, the temperature of the Zn source was raised to 650° C and epitaxial growth was further continued. After about 10 minutes, the temperature of the solution became approximately 750° C, when it was rapidly cooled down to room temperature. The atmosphere was again made a vacuum and substituted with nitrogen gas, the circular lower plate 15 was taken out and Ga on the surface of the grown layer was removed. The thickness of the p layer was found to be approximately 15 - 20 μm. In this way, the n layer was doped with S and N and the p layer with Zn and N, and a p-type grown layer which was not of high resistivity at the surface of the p layer was obtained. In this example of embodiment, 19 pieces of epitaxial wafers of a diameter of approximately 40 mm which had pn junctions were grown in a single process.

According to the method of the present invention, as stated above, the afore-mentioned upper plate protects the afore-mentioned single crystal substrates from the atmosphere before the liquid solution is supplied and, after the solution is supplied when the afore-mentioned lower plate has again been returned to the original position, constrains the supplied solution in shape and volume by the same part of it. In principle, therefore, it is possible to utilize the whole area of the lower plate entirely for the epitaxial growth, except for the area of the liquid solution supplying opening.

Moreover, the present invention has a characteristic feature in that the length of the afore-mentioned solution reservoir in a radial direction of the afore-mentioned lower plate is greater than its length in the circumferential direction. This feature results in an advantage of reducing idle space. Furthermore, as the afore-mentioned solution reservoir is provided in its bottom with a solution supplying opening which has a cross-sectional area smaller than the surface area of the liquid solution in said solution reservoir, idle space is further reduced and it is thus made possible to supply even a small quantity of liquid solution efficiently.

It is furthermore possible to supply the afore-mentioned constituent and/or impurities through the afore-mentioned upper plate by using a vapor-pervious material for said upper plate or adopting a shape having thin holes or the like and producing an atmosphere containing the constituent of said epitaxial layers to be grown and/or impurities after the afore-mentioned liquid solution has been supplied.

By using this method, it is possible to use a liquid solution consisting of a solvent alone or a liquid solution having an unsaturated quantity of the solute dissolved therein and then to produce an atmosphere containing the active constituent or impurity after the liquid solution has been supplied on the substrate. Because of this, the surface of the substrate before epitaxial layers are grown thereon can be kept clean.

At this juncture, a part of the substrate may be dissolved in the liquid solution. If a temperature gradient is provided above and below the substrate such that the higher the position, the higher the temperature, it is possible to prevent the dissolution of the substrate.

Needless to say, it is possible not only to carry out multi-layer epitaxial growth but also to grow epitaxial layers having a desired composition profile or impurity concentration profile by changing the composition of the atmosphere as the epitaxial growth progresses.

It is also possible to use the afore-mentioned upper plate when made of a material or shape which is not pervious to vapor and to supply the afore-mentioned constituent and/or impurities to the afore-mentioned solution reservoir from an atmosphere containing the constituent of said epitaxial growth layers and/or impurities before the afore-mentioned liquid solution is supplied. Since the substrate comes in contact with the solution that has fully attained an equilibrium state, this found especially effective in the case where no part of the substrate should be dissolved.

Furthermore, it is also possible to remove the afore-mentioned upper plate from the afore-mentioned lower plate after the afore-mentioned liquid solution has been supplied so as to insure a sufficient contact between the atmosphere and the supplied liquid solution, and then to replace it on said lower plate. This is a method particularly effective in the case where it is difficult for the atmosphere and liquid solution to achieve an equilibrium state.

It is also possible to insure a sufficient contact between the atmosphere and supplied liquid solution via the afore-mentioned solution supplying opening also after the afore-mentioned liquid solution has been supplied, by continuing the relative rotation of the afore-mentioned lower plate with respect to the afore-mentioned solution reservoir and upper plate.

It is also possible to provide a vapor supply source for supplying the vapor of at least one kind of the constituents or impurities of the afore-mentioned epitaxial growth layers at a position different from that of the axis of rotation of the afore-mentioned lower plate. This is a method effective for creating a desired atmosphere.

Futhermore, it is possible to have epitaxial layers grown while continuing the rotation of the afore-mentioned lower plate and upper plate in such a condition that they are held together in one body. This is effective for having epitaxial growth layers grown on a large number of substrates with little scattering of properties.

Besides this example of embodiment, various modifications utilizing the afore-mentioned characteristic features of the present invention can be made. For example, the rate of growth can be increased by providing a temperature gradient of 2° – 6° C/cm in the vertical direction, although the temperature of the liquid solution was kept about uniform in the afore-mentioned example of embodiment. It goes without saying that this temperature gradient may be changed after the commencement of epitaxial growth. Generally speaking, the larger the gradient is, the higher the growth but the less high is the quality of the epitaxial layer.

Therefore, it is desirable to select a larger temperature gradient in the beginning of the growth for time saving purposes, but it is desirable to select a smaller gradient for the growth of an active epitaxial layer of high quality. Moreover, it is possible to have epitaxial layers grown at a constant temperature, for example keeping them at a temperature of approximately 800° C, if a temperature gradient of 10° – 50° C/cm is provided and $PH_3$ gas is added to the vapor.

It is also possible to control the thickness distribution of epitaxial growth layers by providing the afore-mentioned constrained solution with a thickness gradient. Generally speaking, the temperature is a little higher in the peripheral part of the lower plate than in the central part thereof. Therefore, there are cases where it is desirable in order to obtain a more uniform thickness distribution of the epitaxial layers, that the thickness of the supplied solutions be so controlled as to make it thicker in the peripheral part of the lower plate than in the central part thereof.

We claim:

1. A method for simultaneously growing a plurality of single-crystal epitaxial layers of semiconductors on a plurality of suitable substrates from the liquid phase comprising the steps of,
   placing the substrates respectively in a plurality of wells which are provided in a surface of a rotatable circular lower plate,
   positioning a solution reservoir which has a solution supplying opening at the bottom on a radius of and on said lower plate surface,
   covering said lower plate except the position of said reservoir with a circular upper plate which is provided in a non-rotatable state relative to said reservoir,
   supplying small portions of liquid solution from said reservoir through said reservoir opening onto the surfaces of all said substrates by rotating said lower plate relative to said upper plate and said reservoir, and thereby constraining each of the supplied solution portions in shape and volume by the confines of said upper plate and each of said wells, and
   simultaneously growing an epitaxial layer from each of the constrained solutions on each of said substrates.

2. A method as set forth in claim 1 wherein said upper plate is made of a vapor-pervious material or a material with thin holes and which is characterized in that an atmosphere is generated over said upper plate after said small portions of liquid solution are supplied which atmosphere includes at least one element selected from the group consisting of a constituent of said epitaxial layer, a volatile compound of said constituent, a dopant and a volatile compound of said dopant, said at least one element supplied into each of said constrained solutions through said upper plate.

3. A method as set forth in claim 2 wherein said epitaxial layer is composed of gallium phosphide and said at least one element is selected from the group consisting of $H_2S$, Zn and $NH_3$.

4. A method as set forth in claim 1 wherein said upper plate is made of a vapor non-pervious material and which is characterized in that an atmosphere is generated over said reservoir before said small portions of liquid solution are supplied which atmosphere includes at least one element selected from the group consisting of a constituent of said epitaxial layer, a volatile compound of said constituent, a dopant and a volatile compound of said dopant, said at least one element dissolved into said solution in said reservoir.

5. A method as set forth in claim 1 including the step of maintaining the sufficient vapor-liquid communication between an atmosphere generated over said upper plate and said supplied solutions by separating said upper plate from said lower plate after said small portions of liquid solution are supplied and thereafter covering said lower plate except the position of said reservoir with said upper plate.

6. A method as set forth in claim 4 wherein said epitaxial layer is composed of gallium phosphide and said at least one element is selected from the group consisting of $H_2S$, Zn and $NH_3$.

7. A method as set forth in claim 1 including the step of maintaining sufficient vapor-liquid communication between an atmosphere generated over said upper plate and said supplied solutions by continuing to rotate said lower plate relative to said upper plate and said reservoir after said small portions of liquid solution are supplied.

8. A method as set forth in claim 1 including the step of continuing to rotate said lower plate and said upper plate as one body while growing said epitaxial layers.

9. A method as set forth in claim 1 wherein the thickness of said supplied solutions is controlled to be thicker in the peripheral part of said lower plate than in the central part thereof.

10. A method as set forth in claim 1 including the step of maintaining a downwardly decreasing temperature gradient between said upper plate and said lower plate.

11. The method of claim 10 wherein said temperature gradient is 2° – 6° C/cm, while the average temperature is slowly decreased.

12. The method of claim 10 wherein said temperature gradient is 10° – 50° C/cm, while the average temperature is kept constant.

13. The method of claim 10 including the step of changing said gradient after said epitaxial layers have begun to grow.

* * * * *